US008952429B2

(12) United States Patent
Yin et al.

(10) Patent No.: US 8,952,429 B2
(45) Date of Patent: Feb. 10, 2015

(54) TRANSISTOR AND METHOD FOR FORMING THE SAME

(75) Inventors: Haizhou Yin, Poughkeepsie, NY (US); Zhijong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/107,860

(22) Filed: May 13, 2011

(65) Prior Publication Data

US 2012/0061736 A1 Mar. 15, 2012

Related U.S. Application Data

(63) Continuation of application No. PCT/CN2011/000292, filed on Feb. 24, 2011.

(30) Foreign Application Priority Data

Sep. 15, 2010 (CN) .......................... 2010 1 0284792

(51) Int. Cl.
H01L 29/772 (2006.01)
H01L 21/265 (2006.01)
H01L 29/78 (2006.01)
H01L 29/417 (2006.01)

(52) U.S. Cl.
CPC .......... *H01L 21/26506* (2013.01); *H01L 29/78* (2013.01); *H01L 29/7848* (2013.01); *H01L 29/41783* (2013.01)
USPC .......................................... 257/288; 438/795

(58) Field of Classification Search
USPC ....................................................... 257/288
See application file for complete search history.

(56) References Cited

U.S. PATENT DOCUMENTS

| 5,930,609 | A * | 7/1999 | Young .......................... 438/166 |
| 6,238,976 | B1 * | 5/2001 | Noble et al. ................... 438/259 |
| 7,247,547 | B2 * | 7/2007 | Zhu et al. ...................... 438/486 |
| 7,410,876 | B1 | 8/2008 | Min et al. ...................... 438/301 |
| 7,872,504 | B2 * | 1/2011 | Kim et al. ...................... 326/120 |
| 7,888,221 | B2 * | 2/2011 | Kavalieros et al. ............ 438/301 |
| 7,897,493 | B2 * | 3/2011 | Fiorenza et al. ............... 438/486 |
| 8,115,194 | B2 | 2/2012 | Yang ............................... 257/18 |
| 2004/0235280 | A1 | 11/2004 | Keys et al. ..................... 438/528 |
| 2006/0099765 | A1 * | 5/2006 | Yang .............................. 438/301 |
| 2007/0246752 | A1 * | 10/2007 | Cheng et al. .................. 257/288 |
| 2009/0134470 | A1 * | 5/2009 | Yang .............................. 257/369 |
| 2009/0212368 | A1 | 8/2009 | Yang .............................. 257/368 |

(Continued)

FOREIGN PATENT DOCUMENTS

| CN | 101390209 A | 3/2009 | .......... H01L 21/8238 |
| WO | WO 2009/094376 A2 | 7/2009 | ............ H01L 21/336 |

*Primary Examiner* — Michael Trinh
*Assistant Examiner* — Damian A Hillman
(74) *Attorney, Agent, or Firm* — Martine Penilla Group, LLP

(57) ABSTRACT

The present invention relates to a stress-enhanced transistor and a method for forming the same. The method for forming the transistor according to the present invention comprises the steps of forming a mask layer on a semiconductor substrate on which a gate has been formed, so that the mask layer covers the gate and the semiconductor substrate; patterning the mask layer so as to expose at least a portion of each of a source region and a drain region; amorphorizing the exposed portions of the source region and the drain region; removing the mask layer; and annealing the semiconductor substrate so that a dislocation is formed in the exposed portion of each of the source region and the drain region.

11 Claims, 8 Drawing Sheets

(56) References Cited

U.S. PATENT DOCUMENTS

| | | | |
|---|---|---|---|
| 2010/0038685 A1* | 2/2010 | Weber et al. | 257/288 |
| 2010/0148270 A1* | 6/2010 | Golonzka et al. | 257/369 |
| 2011/0027978 A1* | 2/2011 | Hargrove et al. | 438/585 |
| 2012/0132966 A1* | 5/2012 | Doris et al. | 257/288 |

\* cited by examiner

US 8,952,429 B2

1

TRANSISTOR AND METHOD FOR FORMING THE SAME

CLAIM OF PRIORITY

This application claims priority under 35 U.S.C. §§120 and 365(c) as a continuation application of prior International Application No. PCT/CN2011/000292, filed Feb. 24, 2011, and which was not published in English under PCT Article 21(2). The PCT/CN2011/000292 application in turn claims priority to Chinese Application No. CN 201010284792.1, filed on Sep. 15, 2010. The disclosures of the prior international application and Chinese application are incorporated herein by reference.

FIELD OF THE INVENTION

The present invention relates to the field of semiconductor device manufacturing, and particularly, to a transistor and a method for forming the same.

BACKGROUND OF THE INVENTION

Typically, integrated circuits comprise a combination of N-type Metal Oxide Semiconductor (NMOS) and P-type Metal Oxide Semiconductor (PMOS) transistors formed on a substrate. The performance of an integrated circuit is directly related to the performance of transistors which it comprises. Therefore, it is desirable to improve the driving current of a transistor so as to enhance the performance thereof.

US patent application No. 2010/0038685A1 discloses a transistor in which dislocations are formed between the channel region and the source/drain region. The dislocations may cause tensile stress, which may improve the electron mobility in the channel and thus increase the driving current in the transistor. FIGS. 9a-c in the present application show the formation of such dislocations. In FIG. 9a, silicon is implanted into a semiconductor substrate 1 on which a gate dielectric layer 2 and a gate 3 have been formed, so as to form amorphous regions as indicated by the shaded portions in the figure. Then the semiconductor substrate 1 is annealed so as to re-crystallize the amorphous regions. As indicated by the arrows in FIG. 9b, the crystal growth front in the horizontal direction and the crystal growth front in the vertical direction meet during the process of the re-crystallization. As a result, dislocations are formed as shown in FIG. 9c.

SUMMARY OF THE INVENTION

An object of the present invention is to provide a transistor and a method for forming the same.

The method for forming a transistor according to the present invention comprises the steps of:

forming a mask layer on a semiconductor substrate on which a gate has been formed, so that the mask layer covers the gate and the semiconductor substrate;

patterning the mask layer so as to expose at least a portion of each of a source region and a drain region;

amorphorizing the exposed portions of the source region and the drain region;

removing the mask layer; and annealing the semiconductor substrate so that a dislocation is formed in the exposed portion of each of the source region and the drain region.

The method for forming a transistor according to the present invention may easily control the position and the number of the formed dislocations by selectively forming a mask layer on the source region and the drain region.

The stress-enhanced transistor according to the present invention comprises a semiconductor substrate;

a gate dielectric layer formed on the semiconductor substrate;

a gate formed on the gate dielectric layer; and a source region and a drain region located in the semiconductor substrate and on respective sides of the gate, wherein at least one of the source and drain regions comprises at least two dislocation.

Due to the fact that there are more dislocations in the source region and the drain region of the transistor of the present invention as compared to the prior art, the tensile stress applied to the channel region is enhanced and thus the electron mobility in the channel region may be further increased.

DETAILED DESCRIPTION OF THE PREFERRED EMBODIMENTS

The preferred embodiments of the present invention will be detailed in the following in combination with the accompanying drawings. The drawings are drawn schematically and not to scale for the purpose of illustrating the embodiments of the present invention rather than limiting the protection scope thereof. The same reference numbers are used to indicate same or similar components throughout the drawings. Processes and device structures that are well known in the art are omitted here in order to make the technical solutions of the present invention clearer.

Figure 1:
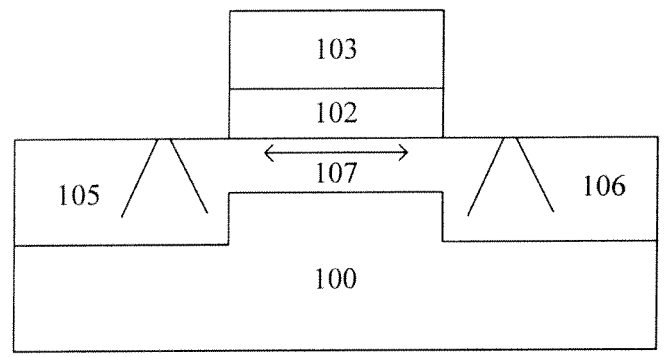
FIG. 1 schematically illustrates a cross-section view of a transistor according to an embodiment of the present invention.

FIG. 1 illustrates a cross-section view of a transistor according to an embodiment of the present invention. The transistor comprises a gate dielectric layer 102 formed on a semiconductor substrate 100, a gate 103 formed on the gate dielectric layer 102, a source region 105 and a drain region 106 located on respective sides of the gate 103, and a channel region 107 located between the source region 105 and the drain region 106 and under the gate dielectric layer 102. In the embodiment shown in FIG. 1, there are two dislocations in each of the source region 105 and the drain region 106. Although there is no intersection between the two dislocations as shown in FIG. 1, the present invention is not limited thereto. In another embodiment, there may be intersection between the two dislocations in the source region 105 and the drain region 106. The dislocations may apply tensile stress to the channel region 107 (as shown by the arrow in the figure) so that the electron mobility in the channel region 107 is increased. In a preferred embodiment, the transistor further comprises a semiconductor layer (not shown) on the source region 105 and the drain region 106 so that the dislocations are not exposed to a free surface. The semiconductor layer may be, for example, a layer of Si, SiC, SiGe or Ge. In another preferred embodiment, the source region 105 and the drain region 106 may each have at least two sets of dislocations, with each set of dislocations including two dislocations, which makes it possible to further increase the generated tensile stress and thus the electron mobility in the channel region. Moreover, the position and the number of the dislocations in the source region need not be symmetric to those of the dislocations in the drain region. For example, one of the source region 105 and the drain region 106 may comprise two dislocations while the other one may comprise only one dislocation. The dislocations are preferably formed as close as possible to the channel region 107 so that the tensile stress applied to the channel region may be larger.

In one preferred embodiment, the transistor is an NMOS transistor.

The method for forming the transistor according to the present invention will be described hereinafter in conjunction with the accompany drawings.

Figure 2:
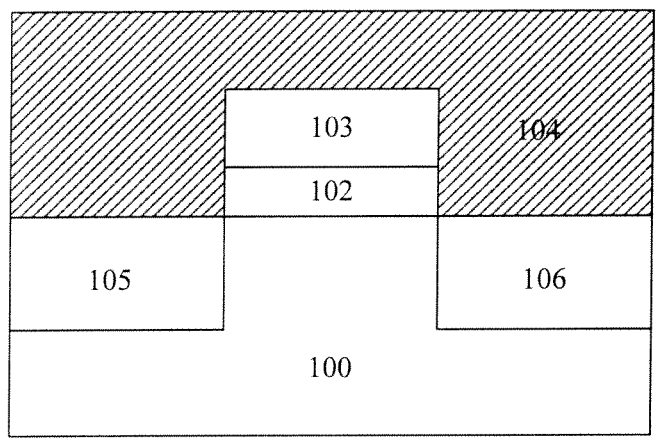
FIG. 2 schematically illustrates a first step of a method for forming a transistor according to an exemplary embodiment of the present invention, in which a mask layer is formed on a semiconductor substrate on which a gate has been formed.

FIG. 2 shows a first step of the method for forming the transistor in accordance with an exemplary embodiment of the invention. As shown in FIG. 2, a mask layer 104 is formed on a semiconductor substrate 100 on which a gate dielectric layer 102 and a gate 103 have been formed, so that the mask layer 104 covers the gate 103 and the semiconductor substrate 100. The mask layer 104 may be formed from photoresist or may be a hard mask layer formed of a dielectric material such as silicon oxide and/or silicon nitride. Although the mask layer 104 is shown to be formed to cover the gate 103 in FIG. 1, the present invention is not limited thereto. The mask layer 104 may be formed to be flushed with the gate 103 or lower than the gate 103.

Figure 3:
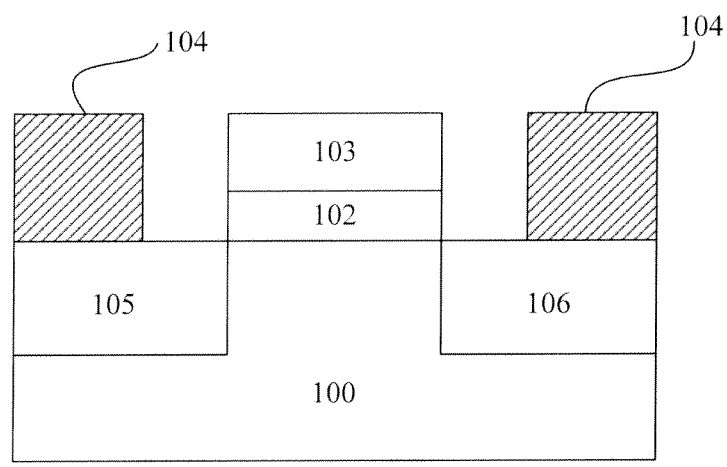
FIG. 3 schematically illustrates a second step of the method for forming the transistor according to the exemplary embodiment of the present invention, in which the mask layer is patterned.
Figure 4A:
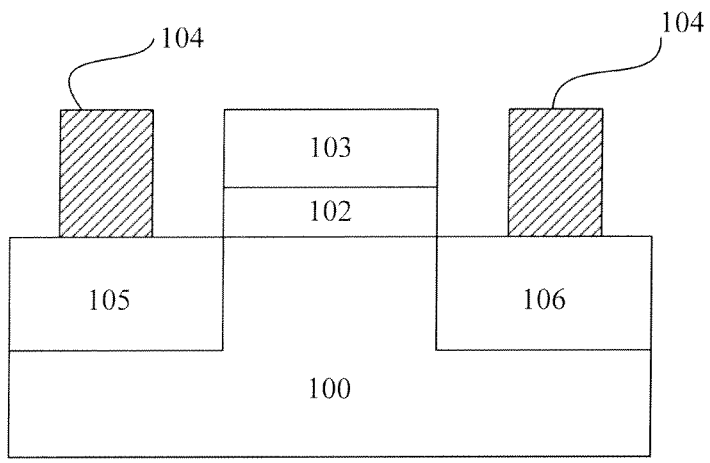
FIGS. 4a, 4b and 4c schematically illustrate three variations of the second step shown in FIG. 3, respectively.
Figure 4B:
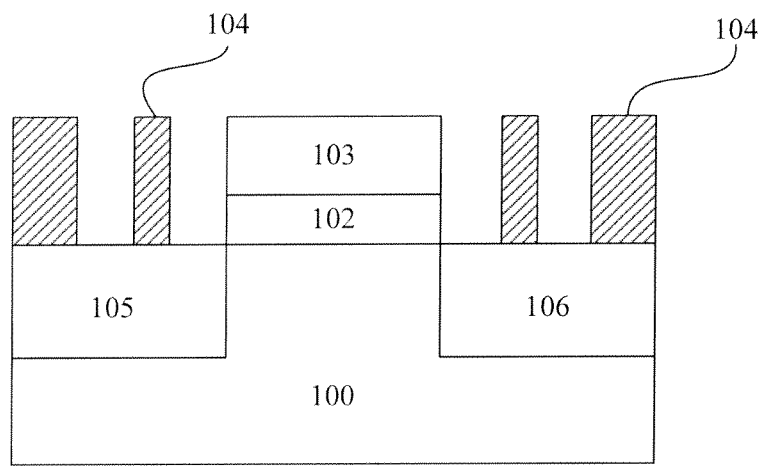
Figure 4C:
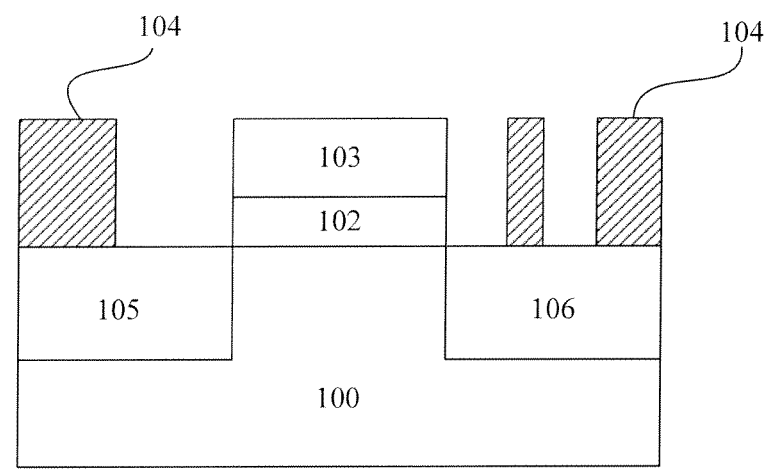

FIG. 3 shows a second step of the method for forming the transistor subsequent to the first step shown in FIG. 2. In the second step, the mask layer 104 may be patterned by, for example, photolithography, so that at least a portion of each of the source region 105 and the drain region 106 is exposed. It shall be noted that the terms "source region" and "drain region" refer to the regions in which the source and drain of the transistor are to be formed, respectively, or the regions in which the source and drain of the transistor have been formed, respectively, by performing ion implantation. In FIG. 3, the portions of the source region 105 and the drain region 106 adjacent to the gate are shown to be exposed. In one preferred embodiment, the mask layer 104 is patterned so that at least the portions of the source region and the drain region that are adjacent to the gate are exposed. In such a way, the dislocations to be formed subsequently are closer to the channel region, which makes it favorable for the stress caused by the dislocations to be sufficiently applied to the channel region. FIG. 4a shows a variation of the second step, in which the mask layer 104 is patterned such that only portions on the middle of each of the source region 105 and the drain region 106 remain. FIG. 4b shows another variation of the second step. Although FIG. 4a and FIG. 4b show that each of the source region 105 and the drain region 106 has two portions thereof exposed with the mask layer left between adjacent exposed portions, the present invention is not limited thereto. Each of the source region and drain region may have more than two adjacent exposed portions. In the structures shown in FIG. 3, FIG. 4a and FIG. 4b, the position and the number of the exposed portions of the source region are symmetric to those of the exposed portions of the drain region. However, the present invention is not limited thereto. The position and the number of the exposed portions of the source region may be asymmetric to those of the exposed portions of the drain region. The position and the number of the exposed portions of the source region and the drain region may be selected, respectively, which makes it favorable to design the processes freely according to the requirement of the product. FIG. 4c shows an example in which the position and the number of the exposed portions of the source region are asymmetric to those of the exposed portions of the drain region.

Figure 5:
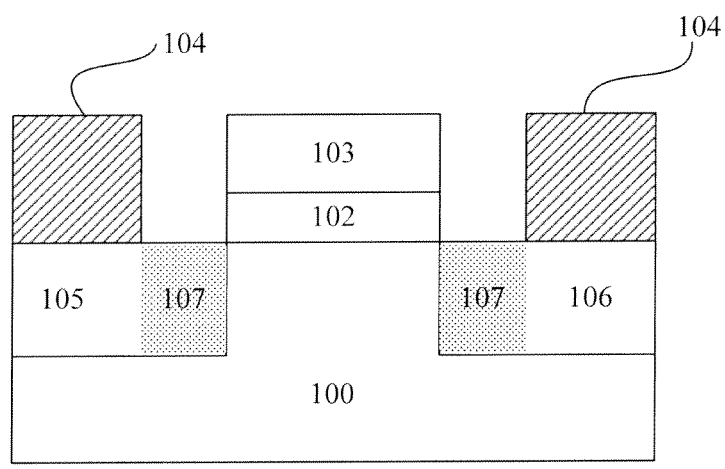
FIG. 5 schematically illustrates a third step of the method for forming the transistor according to the exemplary embodiment of the present invention, in which the exposed portions of the source region and the drain region are amorphorized.

FIG. 5 shows a third step of the method for forming the transistor in accordance with the exemplary embodiment. In the third step, the exposed portions of the source region 105 and the drain region 106 are amorphorized. In an embodiment, the amorphorizing may be achieved by performing ion implantation. The ion implanted may be, for example, one of Si, Ge, P, B and As, or any combination thereof, and the implantation dose may be $>5\times10^{14}$ cm$^{-2}$.

Figure 6:
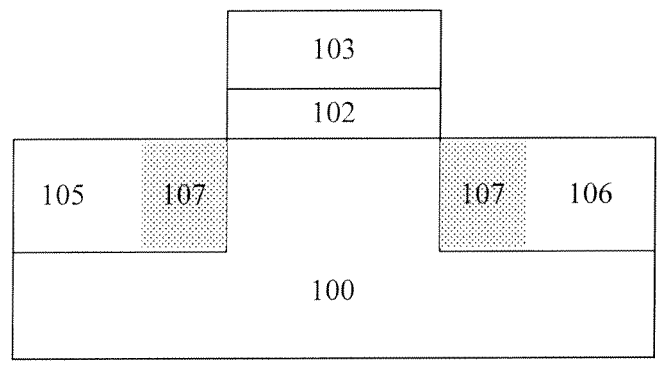
FIG. 6 schematically illustrates a fourth step of the method for forming the transistor according to the exemplary embodiment of the present invention, in which the mask layer is removed.
Figure 7:
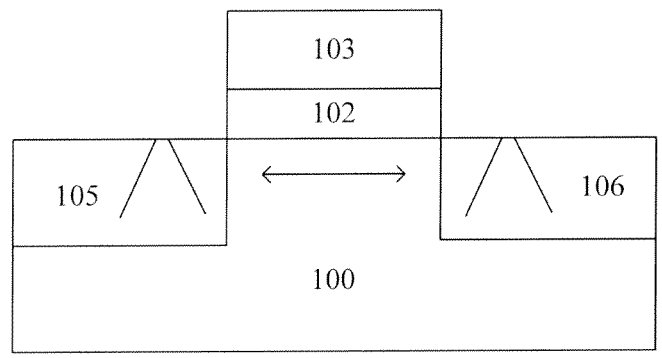
FIG. 7 schematically illustrates a fifth step of the method for forming the transistor according to the exemplary embodiment of the present invention, in which annealing is performed so as to form dislocations in the source region and the drain region.

FIG. 6 shows a fourth step of the method for forming the transistor in accordance with the exemplary embodiment. In the fourth step, the mask layer is removed. FIG. 7 shows a fifth step of the method for forming the transistor in accordance with the exemplary embodiment, in which the amorphorized portions of the source and drain regions are re-crystallized by performing annealing. The temperature of the annealing may be higher than 400° C., preferably 500-900° C. The annealing time may range from several seconds to several minutes. During the process of the re-crystallization, different crystal growth fronts meet and thus two dislocations are formed in each of the source region 105 and the drain region 106. These dislocations may apply tensile stress to the channel region between the source region and the drain region (as shown by the arrow in FIG. 7), and therefore the electron mobility in the channel region is improved. It shall be noted that the fourth step does not be necessarily performed before the fifth step. For example, in the case that the mask layer 104 is a hard mask layer, the fourth step shown in FIG. 5 may be performed after the fifth step shown in FIG. 6.

Figure 8A:
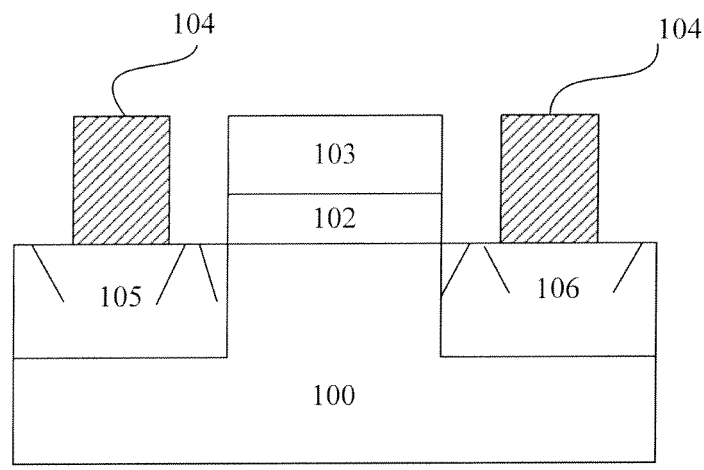
FIGS. 8a, 8b and 8c schematically illustrate dislocations formed in the source region and the drain region when the steps shown in FIGS. 4a, 4b and 4c are performed, respectively.
Figure 8B:
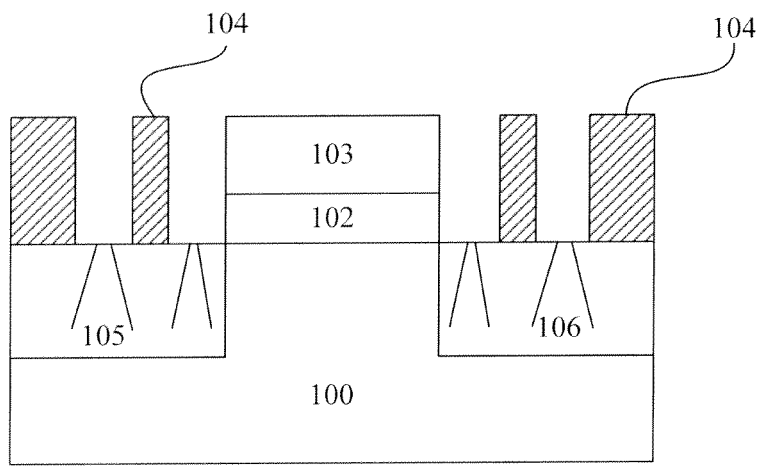
Figure 8C:
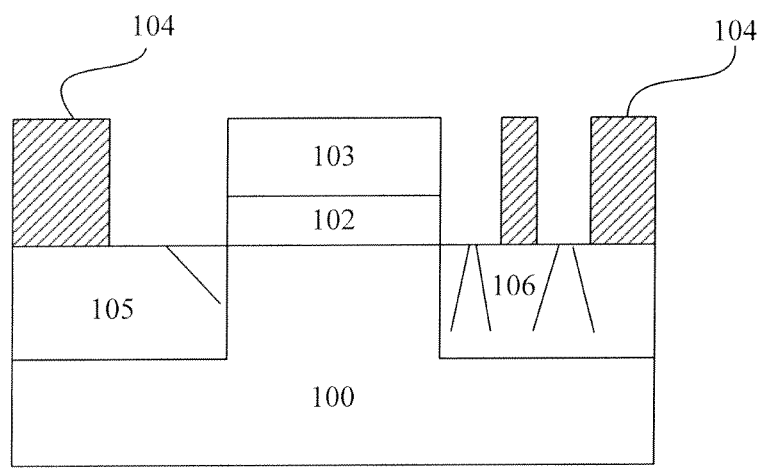
Figure 9A:
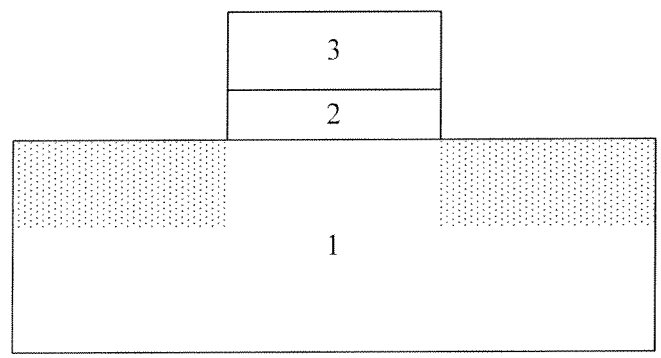
FIGS. 9a-c illustrate the formation of dislocations in the prior art.
Figure 9B:
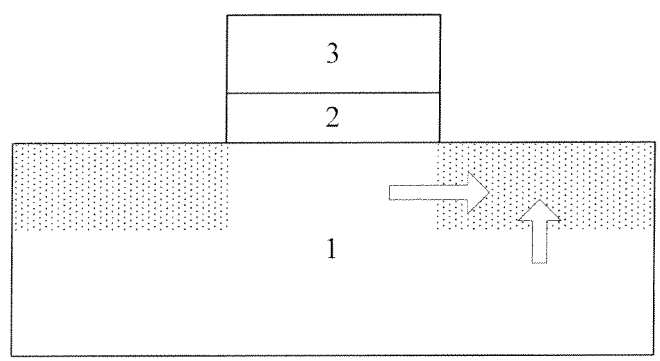
Figure 9C:
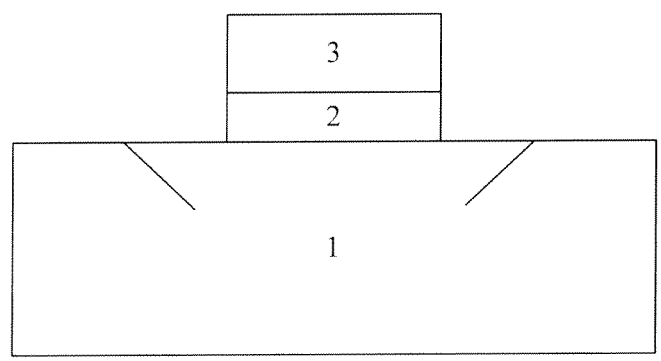

FIGS. 8a, 8b and 8c show the dislocations formed in the source region 105 and the drain region 106 when the steps shown in FIGS. 4a, 4b and 4c are performed, respectively. For the purpose of illustration, the mask layer 104 is also shown in FIGS. 8a, 8b and 8c, although the mask layer 104 may have been removed after the formation of the dislocations in practice.

Afterwards, the doping of the source region and the drain region as well as the formation of the source and drain contacts and so on that are well known in the art may be performed so as to form a complete device.

Although in the above descriptions, the doping processes for forming the source and the drain are performed after the formation of the dislocations, the present invention is not limited thereto. The dislocations may be formed in any suitable phase. For example, the dislocations may be formed after the doping of the source and the drain.

In addition, in one preferred embodiment, a semiconductor layer may be formed on portions of the source and drain regions in which the dislocations are formed, so that the dislocations are not exposed to a free surface and the tensile stress may be prevented from decreasing due to the exposure of the dislocations to the free surface.

The semiconductor substrate mentioned above may be a silicon substrate, a SiGe substrate, a SiC substrate or an III-V semiconductor (for example, GaAs, GaN, etc.) substrate. The gate dielectric layer may be one of $SiO_2$, $HfO_2$, HfSiO, HfSiON, HfTaO, HfTiO, HfZrO, $Al_2O_3$, $La_2O_3$, $ZrO_2$ and LaAlO, or any combination thereof. And the material of the gate may be selected from a group comprising Poly-Si, Ti, Co, Ni, Al, W, the alloy thereof, and the silicide thereof.

The transistor and the method for forming the same according to the present invention are described by way of exemplary embodiments hereinbefore, however, the scope of the present invention does not intend to be limited thereto. Any modification to or variation of the above embodiments that can be contemplated by one skilled in the art will fall within the scope of the present invention defined by the appended claims.

What is claimed is:

1. A method for forming a transistor, comprising the steps of:
    forming a mask layer on a semiconductor substrate on which a gate has been formed, so that the mask layer directly contacts both the gate and the semiconductor substrate;
    patterning the mask layer so as to expose at least two portions of each of a source region and a drain region, wherein the patterned mask layer is only formed between adjacent exposed portions in the source region and between adjacent exposed portions in the drain region;
    amorphorizing the exposed portions of the source region and the drain region;
    removing the patterned mask layer; and
    annealing the semiconductor substrate so that a respective dislocation is formed in the respective exposed portion of each of the source region and the drain region.

2. The method according to claim 1, wherein the semiconductor substrate comprises an NMOS device region and a PMOS device region, and the exposed portions are only located in the NMOS device region.

3. The method according to claim 1, wherein the mask layer is patterned so that at least portions of the source region and the drain region that are adjacent to the gate are exposed.

4. The method according to claim 1, wherein the source region has a first number of exposed portions, the drain region has a second number of exposed portions, and the first number is different from the second number.

5. The method according to claim 1, wherein the mask layer is a layer of photoresist, or a hard mask layer.

6. The method according to claim 1, wherein the mask layer is removed before annealing the substrate.

7. The method according to claim 1, wherein the dislocations apply tensile stress to the channel region between the source region and the drain region so that the electron mobility in the channel region is increased.

8. The method according to claim 1, further comprising forming a semiconductor layer on the source region and the drain region so that the dislocations are not exposed to a free surface.

9. The method according to claim 1, wherein the substrate is a Si substrate, a SiGe substrate, a SiC substrate, a GaAs substrate or a GaN substrate.

10. The method according to claim 1, wherein the amorphorizing is performed by an ion implantation process with an implantation dose of $>5\times10^{14}$ $cm^{-2}$.

11. The method according to claim 10, wherein the implanted ion is one of Si, Ge, P, B, and As, or any combination thereof.

* * * * *